United States Patent
Zhao et al.

(10) Patent No.: US 10,084,476 B1
(45) Date of Patent: Sep. 25, 2018

(54) ADAPTIVE LOSSLESS COMPRESSION IN ANALOG MIXED SIGNAL ENVIRONMENTS

(71) Applicant: Cadence Design Systems, Inc., San Jose, CA (US)

(72) Inventors: Jianzhou Zhao, Concord, CA (US); Daniel de Fonseca Munford Argollo, Santa Clara, CA (US); Vuk Borich, San Jose, CA (US); Hongzhou Liu, Sewickley, PA (US)

(73) Assignee: CANDENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/847,604

(22) Filed: Dec. 19, 2017

(51) Int. Cl.
*H03M 7/30* (2006.01)

(52) U.S. Cl.
CPC ........... *H03M 7/30* (2013.01); *H03M 7/3084* (2013.01)

(58) Field of Classification Search
CPC .............................. H03M 7/30; H03M 7/3084
See application file for complete search history.

(56) References Cited

U.S. PATENT DOCUMENTS

2014/0223029 A1\* 8/2014 Bhaskar ............. H03M 7/3088
709/247

\* cited by examiner

*Primary Examiner* — Howard Williams
(74) *Attorney, Agent, or Firm* — McDermott Will & Emery LLP

(57) ABSTRACT

A method including separating multiple signal waveforms into multiple blocks forming a sequence is provided. Each of the blocks includes at least a portion of each of the multiple signal waveforms. The method includes identifying a shared time portion and a shared signal portion for the signal waveforms within a first block from the multiple blocks and selecting a format for the first block based on a block size of the first block and a block read time of the first block. The method also includes compressing data in the first block based on the shared time portion, the shared signal portion, a preceding block and a subsequent block in the sequence, and storing the first block in a memory based on the format selected for the first block.

20 Claims, 9 Drawing Sheets

ADAPTIVE LOSSLESS COMPRESSION IN ANALOG MIXED SIGNAL ENVIRONMENTS

TECHNICAL FIELD

Embodiments described herein are generally related to the field of data compression in circuit design applications. More specifically, embodiments described herein are related to adaptive, lossless waveform compression in a mixed signal environment for a system on chip (SoC) design.

BACKGROUND

Full chip integration tasks in SoCs commonly include integration of a digital part, an analog part, a power intent, and software (SW). All these parts are commonly performed in simulation. Therefore, simulation engines that test SoCs in mixed signal environments typically result in multiple, large signal output waveforms that are difficult to handle adequately and expediently for analysis. Accordingly, different data compression schemes have been used to reduce the size of signal waveforms stored in a database, with varying degrees of success. A problem that typically arises in this scenario is that highly compressed waveforms include multiple metadata references that increase the read time of the waveforms for de-compression (e.g., for post-simulation analysis). Furthermore, aggressive compression techniques may result in data loss for areas of a dataset that involve high resolution and high frequency signals (e.g., analog components of multiple waveforms).

The description provided in the background section should not be assumed to be prior art merely because it is mentioned in or associated with the background section. The background section may include information that describes one or more aspects of the subject technology.

SUMMARY

In certain aspects, a computer-implemented method including separating multiple signal waveforms into multiple blocks forming a sequence, is provided. Each of the blocks includes at least a portion of each of the multiple signal waveforms. The computer-implemented method further includes identifying a shared time portion and a shared signal portion for the signal waveforms within a first block from the multiple blocks. The computer-implemented method also includes selecting a format for the first block based on a block size of the first block and a block read time of the first block, and compressing data in the first block based on the shared time portion, the shared signal portion, a preceding block and a subsequent block in the sequence. The computer implemented method also includes storing the first block in a memory based on the format selected for the first block.

In certain aspects, a system as disclosed herein includes a memory storing computer code, and at least one processor that executes the computer code to separate multiple signal intervals into multiple blocks forming a sequence. Each of the blocks includes at least a portion of each of the multiple signal waveforms. The at least one processor also executes computer code to identify a shared time portion and a shared signal portion for the signal waveforms within a first block from the multiple blocks, to select a format for the first block, based on a block size of the first block and a block read time of the first block, to compress data in the first block based on the shared time portion, the shared signal portion, a preceding block and a subsequent block in the sequence, and to store the first block in a memory based on the format.

In certain aspects, a non-transitory, computer-readable medium comprising instructions stored in a memory which, when executed by a processor cause a computer to perform a method. The method includes separating multiple signal intervals into multiple blocks forming a sequence wherein each of the blocks includes at least a portion of each of the multiple signal waveforms, and identifying a shared time portion and a shared signal portion for the signal waveforms within a first block from the multiple blocks, and selecting a format for the first block based on a block size of the first block and a block read time of the first block. The method also includes compressing data in the first block based on the shared time portion, the shared signal portion, a preceding block and a subsequent block in the sequence and storing the first block in a memory based on the format selected for the first block.

In certain aspects, a system is described including a means for storing instructions. The system further includes a means to execute the instructions to separate multiple signal intervals into multiple blocks forming a sequence. Each of the blocks includes at least a portion of each of the multiple signal waveforms. The means to execute the instructions also executes instructions to identify a shared time portion and a shared signal portion for the signal waveforms within a first block from the multiple blocks, to select a format for the first block based on a block size of the first block and a block read time of the first block, to compress data in the first block based on the shared time portion, the shared signal portion, a preceding block and a subsequent block in the sequence, and to store the first block in a memory based on the format.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides a method for compressing data in mixed signal simulation environments. More specifically, embodiments as disclosed herein may be used for adaptive data compression in mixed signal environments based not only in data reduction but also in the reading speed of the compressed data file.

The disclosed system addresses a technical problem tied to computer technology and arising in the realm of computer simulation of hardware, namely the technical problem of storing and accessing large data files resulting from the multiple output signals of integrated circuits in mixed signal environments. In some embodiments, each waveform in an output signal from a simulation may include a data size of several hundred Gigabytes (1 Gigabyte=$10^9$ bytes) or more (e.g., up to 800 Gb or even larger). Accordingly, embodiments as disclosed herein address the problem of efficient storage and access of such large data files for analysis. Further, embodiments as disclosed herein perform lossless data compression wherein the original data can be recovered after compression with minimal or no error.

Data compression schemes currently used may provide a high level of compressibility (defined as the ratio of the original size of a file to the compressed size), but with a tradeoff of a high readout latency for the compressed file. This may be problematic in a simulation environment where multiple large signal waveforms may be desirably retrieved from a database, multiple times. Embodiments as disclosed herein provide a solution to this problem by using hybrid data compression formats, concatenated in a sequence that ensures fast access and high compressibility where applicable.

Figure 1:
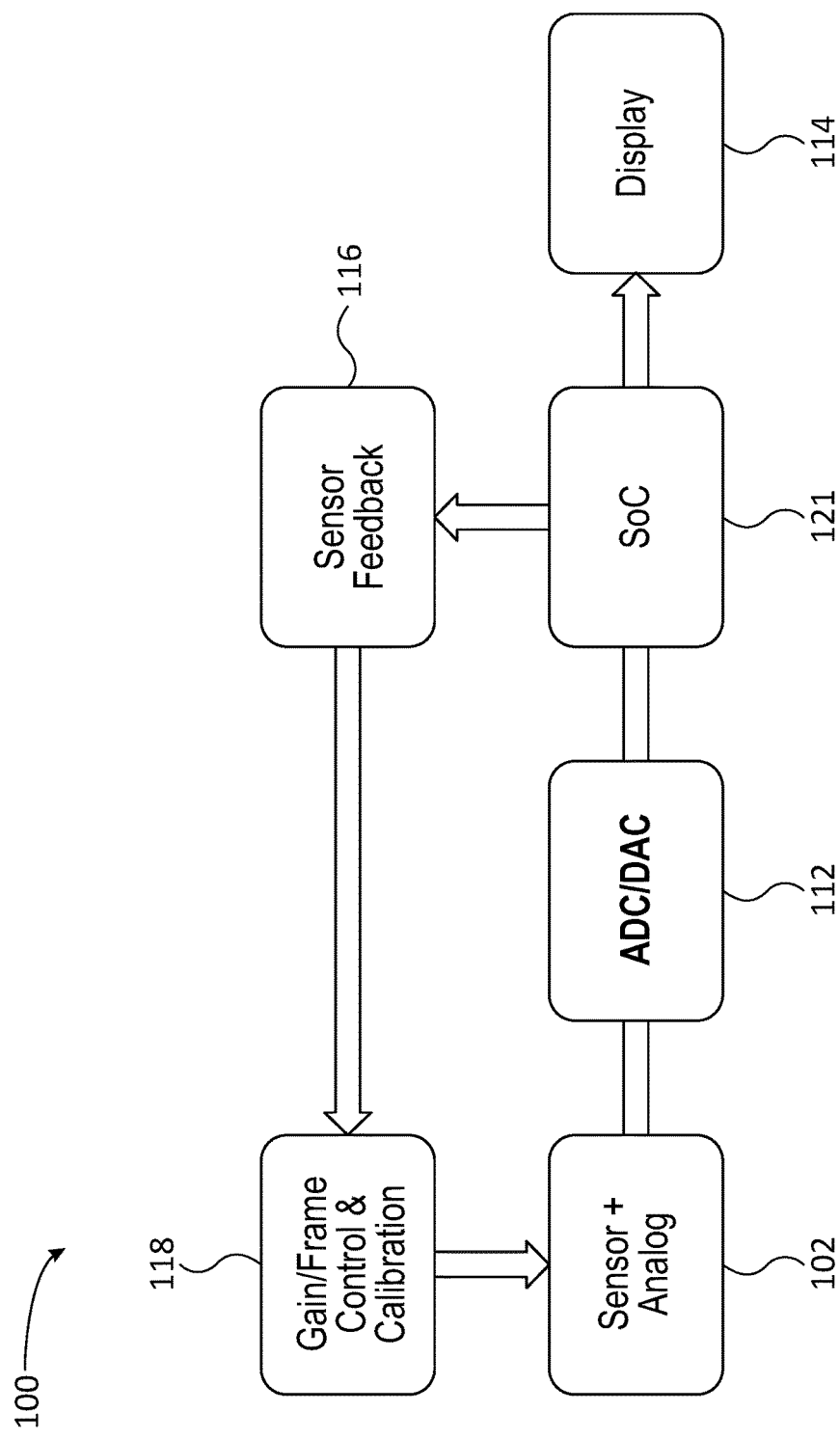
FIG. 1 illustrates a mixed signal (MS) environment including analog and digital components emulated according to some embodiments.

FIG. 1 illustrates a MS environment 100 including analog and digital components emulated according to some embodiments. The circuit design in MS environment 100 may represent, for example, a camera (including digital and analog components) having sensors to adjust various optical settings (e.g., focal length, aperture size, and the like) based on the quality of the image displayed on a flat panel. While the sensor may be an analog device, the image quality may be obtained by a digital processor in the camera. Accordingly, analog components in MS environment 100 may include a sensor 102 and digital components may include a system on a chip (SoC) 121, coupled to sensor 102 through analog to digital converter (ADC) or a digital to analog converter (DAC) 112. Accordingly, SoC 121 may provide a digital/analog input signal to a display 114, and a signal to a sensor feedback block 116. Sensor feedback block 116 may be coupled to a gain/frame control and calibration block 118 that provides a control signal to sensor 102. In some embodiments, display 114, sensor feedback block 116, and gain/frame control and calibration block 118 include digital and analog circuitry.

Current electronic circuit design may include embedded software (SW) commands in SoC 121, which may be able to adjust the configuration of the analog components (e.g., of sensor 102) dynamically. Accordingly, simulation tools as disclosed herein fully incorporate digital and analog components to test the behavior of a circuit in MS environment 100.

Figure 2:
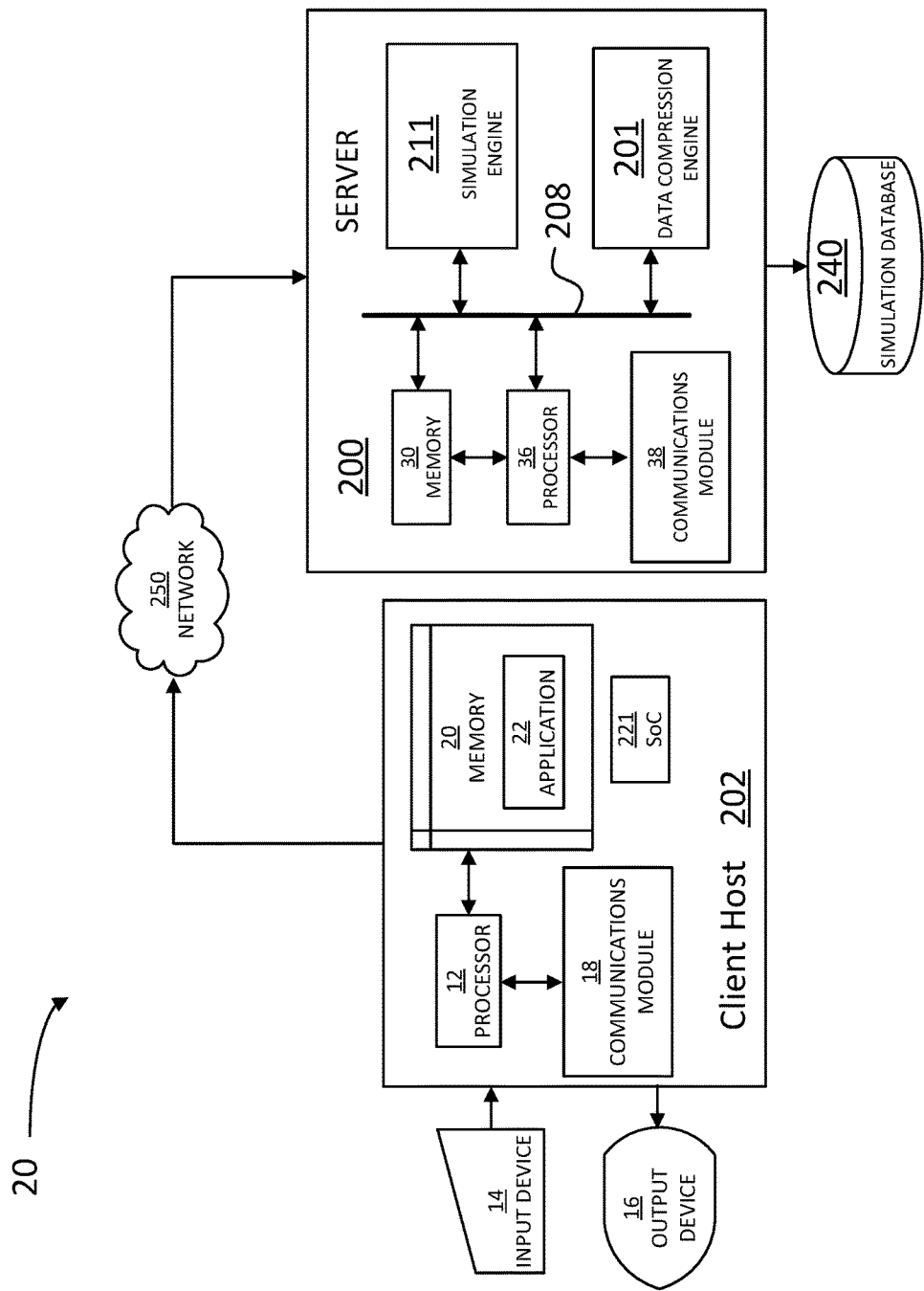
FIG. 2 illustrates an architecture configured to compress simulation data adaptively and with no loss, according to some embodiments.

FIG. 2 illustrates an architecture 20 configured to compress simulation data adaptively and with no loss, according to some embodiments. The simulation data may be generated by a simulation engine 211 from a SoC 221, according to some embodiments. A client host 202 includes a processor 12 configured to execute instructions stored in a memory 20. Memory 20 may include an application 22, which includes commands that when executed by processor 12 cause client host 202 to perform methods consistent with the present disclosure. Application 22 may include a runtime software program running on client host 202 to issue commands to server 200 for controlling a data compression engine 201. For example, application 22 may include an application to control server 200 for SoC 221. SoC 221 may include a register transfer level (RTL) compiler language, e.g., an application specific integrated circuit (ASIC) RTL file configured to handle hardware and software that controls the hardware. Client host 202 may also include a communications module 18 that enables client host 202 to transfer data, provide commands and receive instructions from server 200 through a network 250. Client host 202 may be coupled with an input device 14 (e.g., a mouse, a keyboard, a touch screen display, and the like) and to an output device 16 (e.g., a display, a speaker, and the like). Accordingly, a user may enter commands and queries to client host 202 with input device 14, and receive graphic and other information from client host 202 via output device 16. In some embodiments, application 22 may control input device 14 and output device 16 through a graphic user interface (GUI), enabling a user to have access to server 200 and perform a constrained metric verification analysis on SoC 221.

Server 200 may include a memory 30, a processor 36, and a communications module 38 to transfer data, receive commands and provide instructions from client host 202 through network 250. Memory 30 and processor 36 may be communicatively coupled with a data compression engine 201, as disclosed herein. In some embodiments, a simulation engine 211 is configured to perform simulations of SoC 221 with selected input parameters to obtain multiple output signal waveforms. Data compression engine 201 may be configured to compress and store at least one of the output signal waveforms from simulation engine 211 in simulation database 240. In some embodiments, memory 30, processor 36, simulation engine 211, and data compression engine 201 are communicatively coupled through bus 208. Accordingly, in some embodiments, data compression engine 201 may be configured to compress the simulation data from simulation engine 211 and save the compressed data in a simulation database 240. Simulation database 240 stores data results from multiple simulation samples on SoC 221 run with server 200. In some embodiments, simulation database 240 stores values of environmental properties, controllable properties, and observable properties resulting from multiple simulations of SoC 221.

In some embodiments, data compression engine 201 initially performs simulations over a limited sampling of the device (and software) parameter space with selected system configurations. In the simulations, given a system configuration, a random selection of data traffic is provided to SoC 221 and the results of the simulations are stored in simulation database 240. For example, in some embodiments the random selection of data may include sets of video frames formed from random pixel values (e.g., when the SoC 221 is a video-cam controller). In some embodiments, the simulations may include sets of video frames selected at random from other video frames or pictures available to Server 200. The results stored in simulation database 240 may include values of selected observable properties of the SoC. Based on the results, and using machine-learning techniques from prior simulation history stored in simulation database 240, data compression engine 201 and regression engine 105 select additional simulation configurations to provide a refined analysis. Accordingly, data compression engine 201 and regression engine 105 increase the simulation and analysis efficiency by concentrating on areas of the parameter space for controllable and environmental properties that are critical for performance of SoC 221 (e.g., desirable ranges of one or more observable properties).

Figure 3:
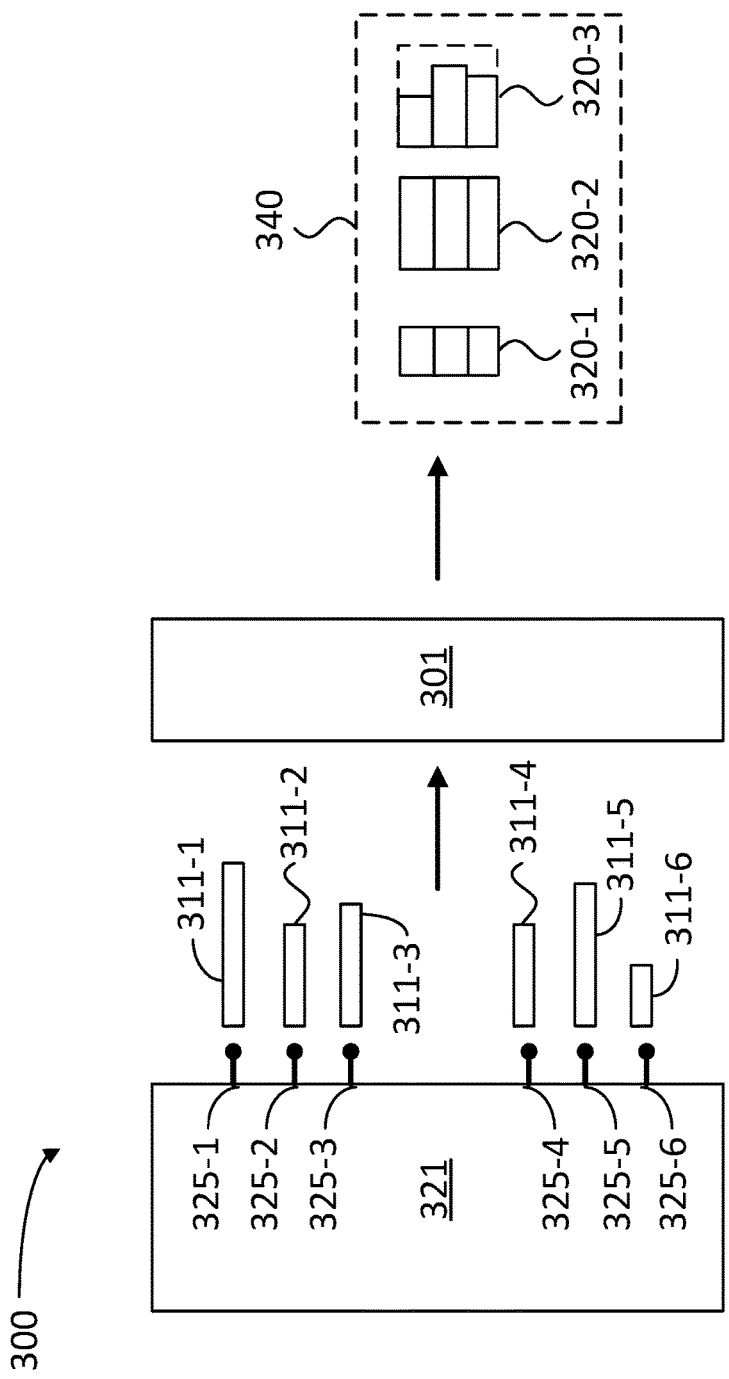
FIG. 3 illustrates a dataflow in a lossless adaptive data compression, according to some embodiments.

FIG. 3 illustrates a dataflow 300 in a lossless adaptive data compression environment, according to some embodiments. A DUT 321 included multiple outputs 325-1 through 325-6 (hereinafter, collectively referred to as "outputs 325"). Each output 325 generates an output signal 311-1 through 311-6 (collectively referred to, hereinafter, as "output signals 311"). A data compression engine 301 receives output signals 311 and provides a compressed dataset 340 to be stored in a simulation database (e.g., simulation database 240).

Compressed dataset 340 includes blocks 320-1, 320-2, and 320-3 (hereinafter, collectively referred to as "blocks 320"). In some embodiments, the size of compressed dataset 340 is desirably smaller or much smaller than the aggregated size of output signals 311 (e.g., 5, 10, or even 100 or more times smaller). In some embodiments, data compression engine 301 performs a lossless compression, wherein the full set of output signals 311 may be recovered from compressed dataset 340.

In some embodiments, data compression engine 301 may use different types of blocks 320, according to the characteristics of the data in output signals 311, and the ability to share data portions within multiple strings of output signals 311. In some embodiments, data compression engine 301 selects the number and type of blocks 320 based on a size reduction of dataset 340 relative to the overall size of output signals 311. Further, in some embodiments, data compression engine 301 selects the number and type of blocks 320 based on a read time for dataset 340. Accordingly, in some embodiments there is a compromise between the size reduction and the read time of dataset 340. For example, an aggressive data reduction strategy may result in multiple metadata call outs within dataset 340 that may slow down the readout of any given output signal 311 from dataset 340. For example, in some embodiments block 320-1 may be highly compressed and have a longer readout latency as compared to block 320-2. Also, block 320-3 may be less compressed than block 320-2, but with a shorter readout latency. Thus, embodiments as disclosed herein may include a hybrid sequence of data blocks that efficiently compresses the size of a data file including multiple signal waveforms while still maintaining a reduced readout latency, as desirable.

Figure 4:
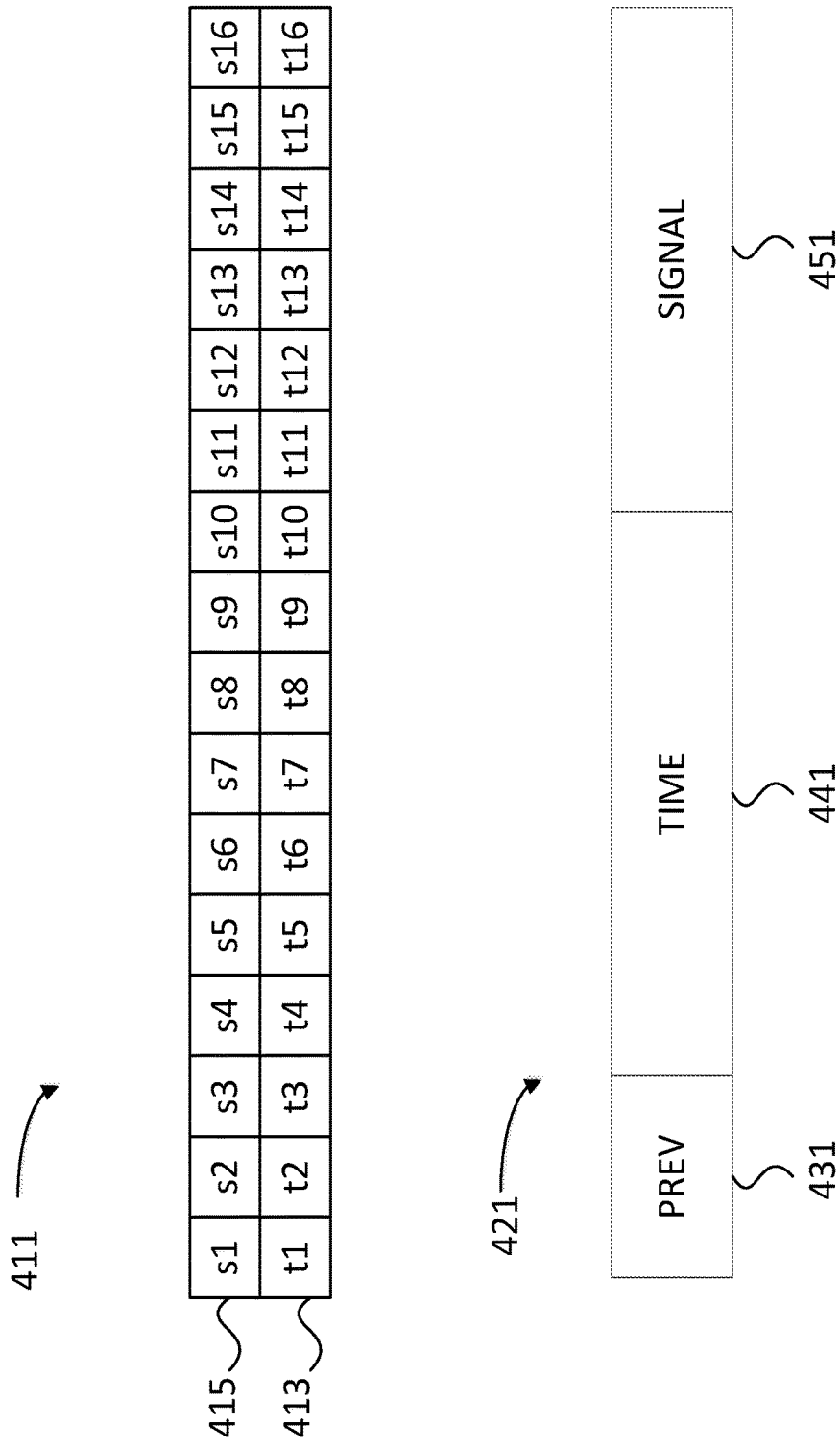
FIG. 4 illustrates a block diagram of a simulation signal in lossless adaptive compression, according to some embodiments.

FIG. 4 illustrates a block diagram of an output signal 411 in a lossless adaptive compression, according to some embodiments. Output signal 411 includes time values ($t_i$) 413 ($t_1$, $t_2$, through $t_{16}$), associated with signal values ($s_i$) 415 ($s_1$, $s_2$, through $s_{16}$). Signal values "si" are the output values of the DUT (e.g., SoC 121, 221, or 321). In the case of a digital output, "si" 415 can have a value "0," or "1." In the case of an analog output "si" 415 can have any value reached by the numerical precision of the simulating tool (e.g., simulation engine 211).

A compressed output signal 421 includes a metadata portion (PREV) 431, a time portion 441, and a signal portion 451. Time portion 441 may include most, but not necessarily all of time values, $t_i$ 413. Likewise, signal portion 451 may include most, but not necessarily all of signal values, $s_i$ 415. In some embodiments signal portion 451 may not include multiple repetitions of the same signal value $s_1$ 415. For example, in the case of a digital signal a long sequence of only zeroes or ones may be replaced in signal portion 451 by a single zero or a single "1" value). And in the case of an analog signal, a periodic signal may be replaced by the signal values over a single period, or by an amplitude, a phase, and a frequency of the periodic signal. In that regard, information about the period, frequency and phase, or the length of a string of zeroes or ones, may be stored in metadata portion 431.

Figure 5:
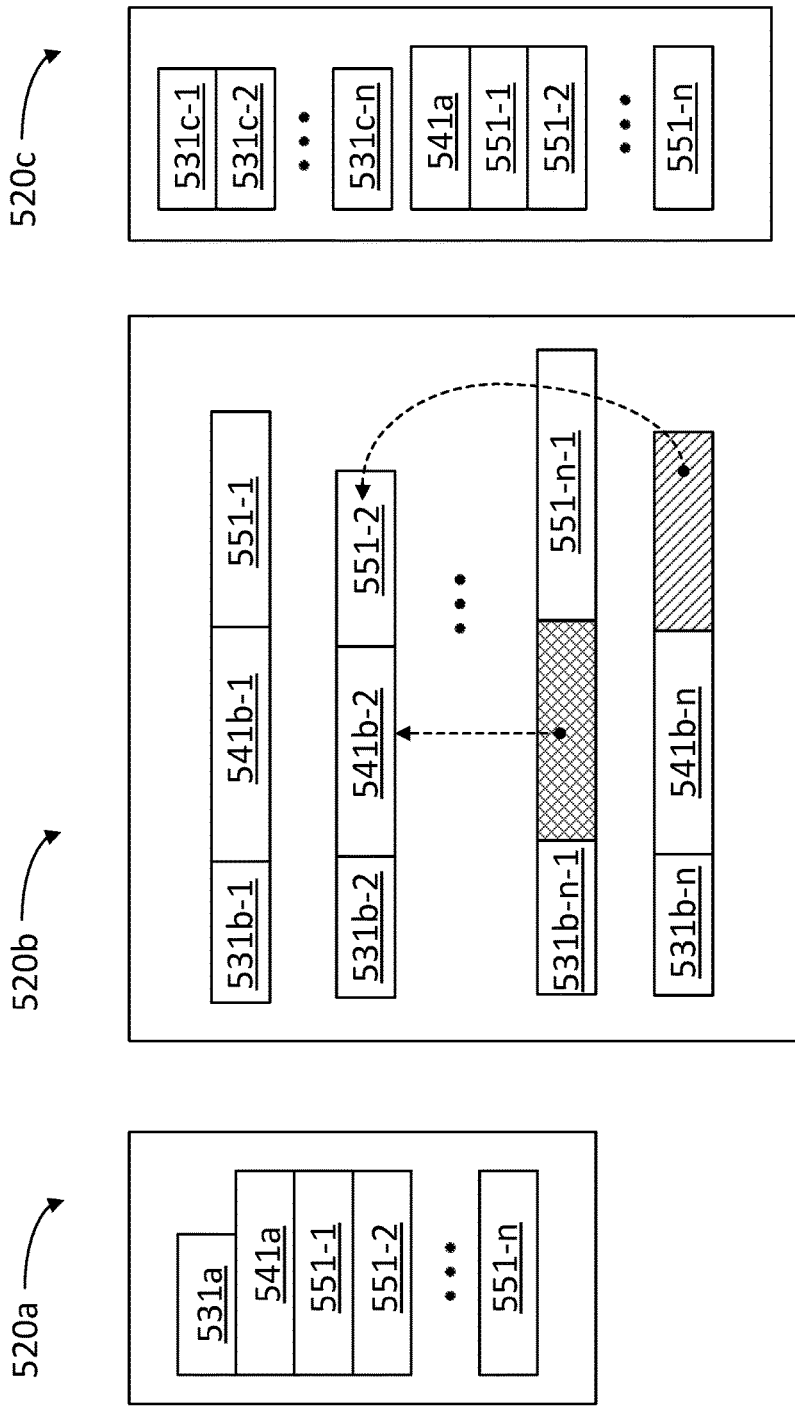
FIGS. 5A-C illustrate diagrams of multiple data block formats for lossless adaptive compression, according to some embodiments.

FIGS. 5A-C illustrate diagrams of multiple data block formats 520a-c, respectively, for lossless adaptive compression, according to some embodiments. Without limitation, it will be assumed that data block formats 520a-c correspond to n signal waveforms produced by a simulation tool (e.g., simulation engine 211). In principle, each of the n signal waveforms includes a time portion and a signal portion. Accordingly, data block formats 520a-c illustrate three different schemes for reducing the amount of information desired to store and recover the n signal waveforms, without loss.

FIG. 5A illustrates format 520a including metadata portion 531a, and a single time portion 541a associated with multiple signal portions 551-1 through 551-n (hereinafter, collectively referred to as "signal portions 551"). Accordingly, signal portions 551 share the same time portion 541a, and thus format 520a reduces the amount of data to be stored by eliminating at least n−1 repeated sequences of time portion 541a.

Metadata portion 531a includes information to map the portion of the n signal waveforms stored in block 520a within the entire sequence of signal waveforms (e.g., location within the sequence of blocks, and length). Because all n-signal portions 551 share the same time portion 541a, a single metadata portion 531a applies to all n signals in format 520a.

FIG. 5B illustrates format 520b including multiple metadata portions 531b-1 through 531b-n (hereinafter, collectively referred to as "metadata portions 531b"), multiple time portions 541b-1 through n (hereinafter, collectively referred to as "time portions 541b") and multiple signal portions 551. Note that block 520b reuses time values 541b-2 in the n−1 sequence corresponding to signal values 551-n−1. Accordingly, in some embodiments, the time portion in signal waveform n−1 of block 520b includes a reference indicating the address or location of time portion 541b-2 in the second signal waveform (cf. broken arrow). Also, block 520b reuses signal values 551-2 in the sequence for $n_{th}$ signal having time values 541b-n. Likewise, in some embodiments, the signal portion in signal waveform n of block 520b includes a reference indicating the address or location of signal portion 551-2 in the second signal waveform (cf. broken arrow).

Metadata portions 531b include information to map the portion of each of the n signal waveforms stored in block 520b within the entire sequence of signal waveforms (e.g., location within the sequence of blocks, and length). Because, in general, each of the n-signal portions 551 includes its own time portion 541b-i (where "i" is any integer between 1 and n), a metadata portion 531b-i applies to each of then signals in format 520b.

FIG. 5C illustrates format 520c including multiple metadata portions 531c-1 through 531c-n (hereinafter, collectively referred to as "metadata portions 531c"). Format 520c includes shared time portion 541a and multiple signal portions 551 (cf. format 520a). In some embodiments, a data block formatted as in format 520c is a transitional data block, e.g., stands between a data block in format 520a and a data block in format 520b.

Metadata portions 531c include information to map the portion of each of the n signal waveforms stored in block 520c within the entire sequence of signal waveforms (e.g., location within the sequence of blocks, and length). All n-signal portions 551 share the same time portion 541a in block 520c. However, in some embodiments block 520c precedes a block 520b, wherein each of the n-signal portions 551 includes its own time portion 541b-i, a metadata portion 531b-i applies to each of then signals in format 520b (where i is any integer from 1 to n). Accordingly, block 520c includes a metadata portion 531c-i for each of the n signal waveforms, to pass the information to metadata portion 531b-i in block 520b.

Figure 6:
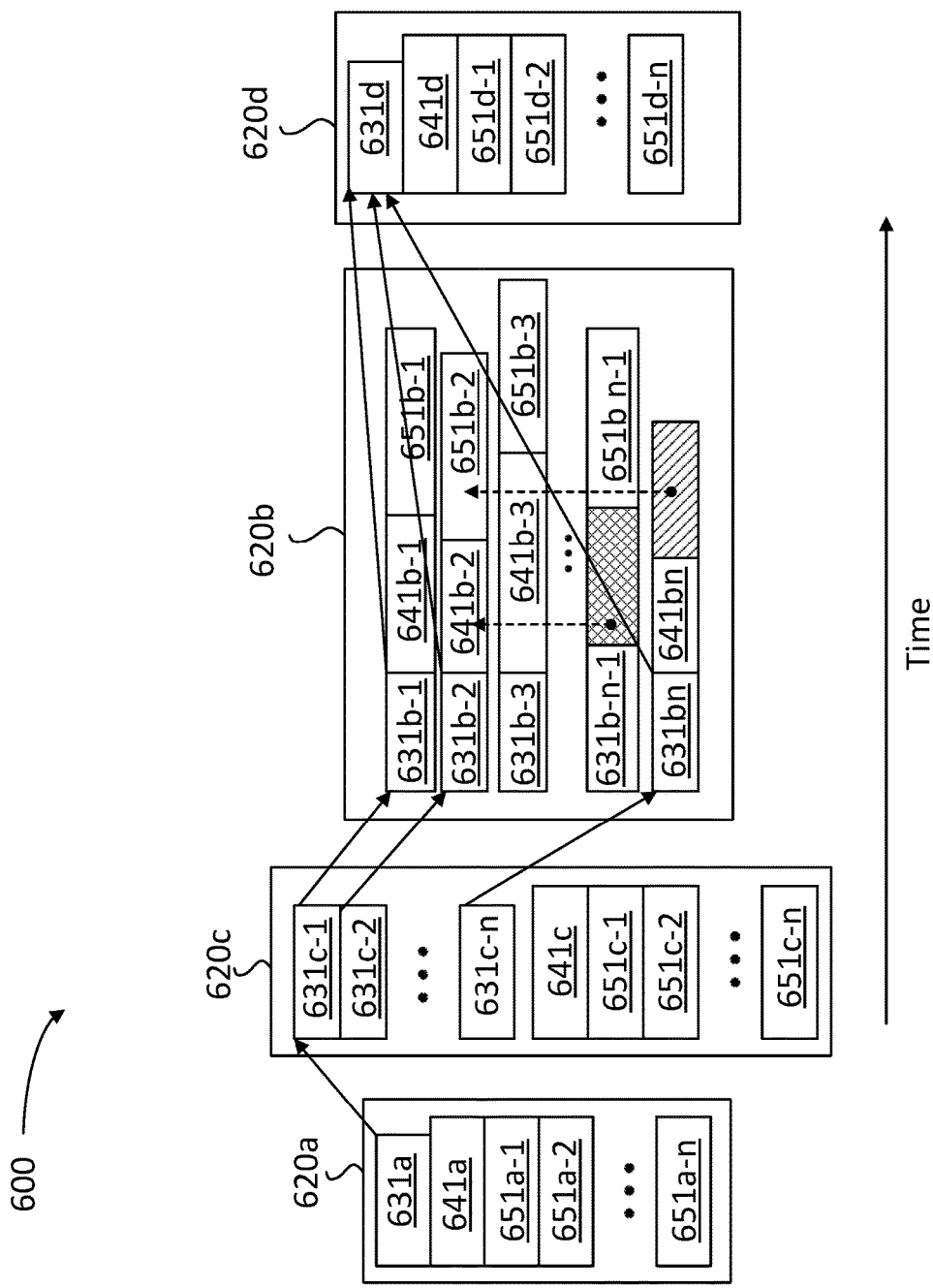
FIG. 6 illustrates a sequence of data blocks in multiple formats according to some embodiments of lossless adaptive compression.

FIG. 6 illustrates a sequence 600 of blocks 620a, 620c, and 620b (hereinafter, collectively referred to as "blocks 620") in multiple formats, according to some embodiments of lossless adaptive compression. Block 620a is formatted according to format 520a, followed by block 620c, which is formatted according to format 520c, and is followed by block 620b, which is formatted according to format 520b. Block 620d is formatted according to format 520a. While sequence 600 shows four blocks in three different formats, there is no limitation in the number and format of blocks that may be included in a data sequence consistent with the present disclosure. Furthermore, one or more blocks in format 520a may be subsequent to each other, and one or more blocks in format 520b may be subsequent to each other. Moreover, one or more blocks in format 520a may be subsequent to one or more blocks in format 520b.

Note that in some embodiments a block in a 520c format (e.g. block 620c) is between a block in 520a format (e.g., block 620a) and a block in a 520b format (e.g., block 620b). This is because each of metadata portions 631c are arranged to point to a corresponding metadata portion 631b in block 620b. The corresponding metadata portion 631b is associated with a time portion 641b-i (where i is any integer from 1 to n) and a signal portion 651b-i that is a continuation of time portion 641c-i and signal portion 651c-i, which is in turn a continuation of time portion 641a and signal portion 651a-i.

Note that block 620b reuses time values 641b-2 in the (n−1) sequence corresponding to signal values 651b-(n−1). Accordingly, the time portion of the n−1 signal waveform in block 620b is replaced by a reference indicating address or location of time portion 641b-2 in the second signal waveform (cf. broken arrow). Also, block 620b reuses signal values 651b-2 in the sequence for nth signal having time values 641b-n (cf. block 520b). Likewise, in some embodiments, the signal portion in signal waveform n of block 620b includes a reference indicating the address or location of signal portion 651b-2 in the second signal waveform (cf. broken arrow). Table I below illustrates some examples of data compression obtained for different SoC simulations, using sequences consistent with sequence 600. In Table I, the original simulation waveform files correspond to output waveforms for different input parameters in a mixed signal environment of a SoC, as disclosed herein.

TABLE 1

| Original Simulation Waveform File | Original Size | Compressed Size | Compression Factor |
|---|---|---|---|
| 1 | 71 Gb | 3.5 Gb | 20× |
| 2 | 325 Mb | 67 Mb | 4.9× |
| 3 | 19 Gb | 5.9 Gb | 3.2× |
| 4 | 18 Gb | 4.5 Gb | 7.2× |

As can be seen from Table I, the compression factor may vary between different input files, illustrating the adaptive nature of compression techniques consistent with the present disclosure.

In some embodiments, sequence 600 results in size reduction of about 61% to 68% of the original signal waveform file, on average. More specifically the size of sequence 600 may be at least 50% smaller than the original signal waveform file in about 25% to 46% of the simulations. Compared to other data compression techniques, a hybrid, adaptive data compression technique as disclosed herein (e.g., sequence 600) may result in data compression that is about 20% to 40% better (smaller output sequence 600). Further, hybrid, adaptive data sequence 600 may be one-half the size of the result from other data compression techniques in about 12% to about 52% of the original simulation waveform examples.

Figure 7:
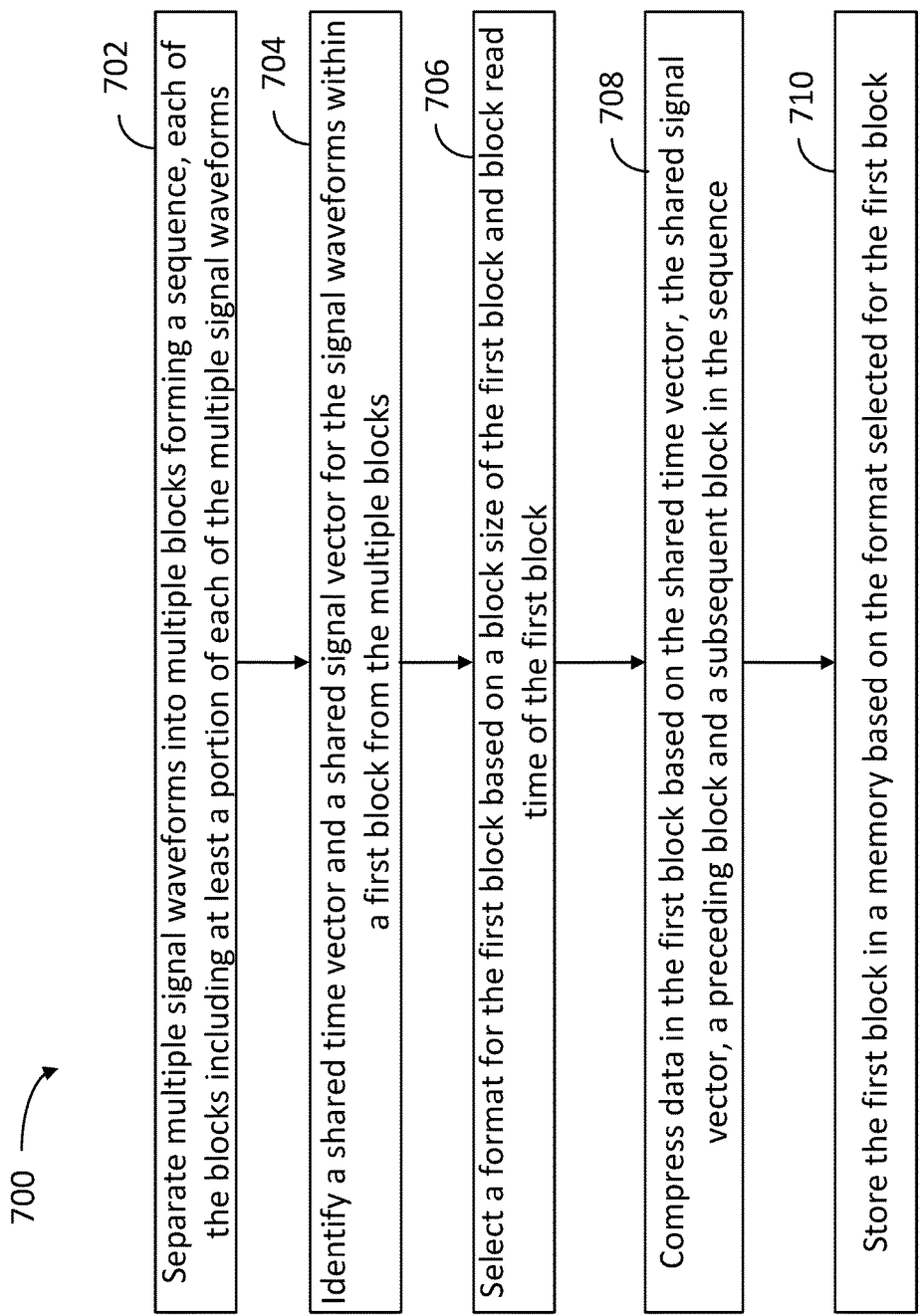
FIG. 7 illustrates a flow chart including steps in a method for lossless, adaptive data compression, according to some embodiments.

FIG. 7 illustrates a flow chart 700 including steps in a method for lossless, adaptive data compression, according to some embodiments. At least some of the steps in method 700 may be performed by a computer having a processor executing commands stored in a memory of the computer (e.g., client host 202 or server 200, processors 12 or 36, and memories 20 or 30). In some embodiments, at least some of the commands may be stored as part of a constrained analysis application installed in a computer (e.g., application 22 in client host 202, data compression engine 201). Further, steps as disclosed in method 700 may include retrieving, editing, and/or storing files in a database that is part of, or is communicably coupled to, the computer (e.g., simulation database 240). Methods consistent with the present disclosure may include at least some, but not all of the steps illustrated in method 700, performed in a different sequence. Furthermore, methods consistent with the present disclosure may include at least two or more steps as in method 700, performed overlapping in time, or almost simultaneously.

In some embodiments, at least one or more of the steps in method 700 may be performed in a cloud computing environment, wherein a computer may include servers, such as a master server and a slave server. Accordingly, at least some of the steps illustrated in method 700 may be performed in parallel in different processors, following separate computational threads. For example, each of the separate computational threads may be performed by at least one of slave servers in each of multiple applications and processors dedicated to the specific computational thread.

Step 702 includes separating multiple signal waveforms into multiple blocks, forming a sequence, wherein each of the blocks includes at least a portion of each of the multiple signal waveforms. In some embodiments, step 702 includes receiving multiple signal waveforms from a simulation engine, the multiple signals associated with simulated output signals from an SoC. In some embodiments, step 702 includes: estimating a compression ratio for the sequence and estimating a read time for the sequence, wherein the sequence comprises a partition of multiple signals from a simulation engine, and selecting the partition of multiple signal waveforms based on the compression ratio for the sequence and the read time for the sequence. In some embodiments, step 702 includes performing a linear regression with parameters associated with each of a plurality of randomly selected partitions, wherein the parameters comprise a block size, a block format, a block compression ratio, and a block read out time.

Step 704 includes identifying a shared time portion and a shared signal portion for the multiple signals waveforms within a first block from the multiple blocks.

Step 706 includes selecting a format for the first block based on block size of the first block and block read time of the first block. In some embodiments, step 706 includes selecting a format comprising a single metadata register, the shared time portion, and multiple signal waveforms associated with the shared time portion. In some embodiments, step 706 includes selecting a format that includes multiple metadata registers with a shared time portion and multiple signal waveforms associated with the shared time portion when the preceding block comprises a single metadata register and the subsequent block comprises multiple time portions. In some embodiments, step 706 includes selecting a format that includes multiple metadata registers with multiple time portions and multiple signal portions, wherein each metadata register is associated with a time portion and a signal portion. In some embodiments, step 706 includes forming the sequence such that a hybrid block is placed between a single time portion block and a multiple time portion block, and wherein the hybrid block includes multiple metadata registers associated with multiple signal portions.

Step 708 includes compressing data in the first block based on the shared time portion and the shared signal portion, a preceding block and a subsequent block in the sequence.

Step 710 includes storing the first block in a memory based on the format selected for the block. In some embodiments, step 710 includes inserting a metadata register for the shared time portion and for the shared signal portion, wherein the metadata register includes a memory address and a length for a location of the shared time portion and the shared signal portion in the sequence. In some embodiments, step 710 further includes inserting in the first block a metadata register that matches a metadata register for a preceding block.

Figure 8:
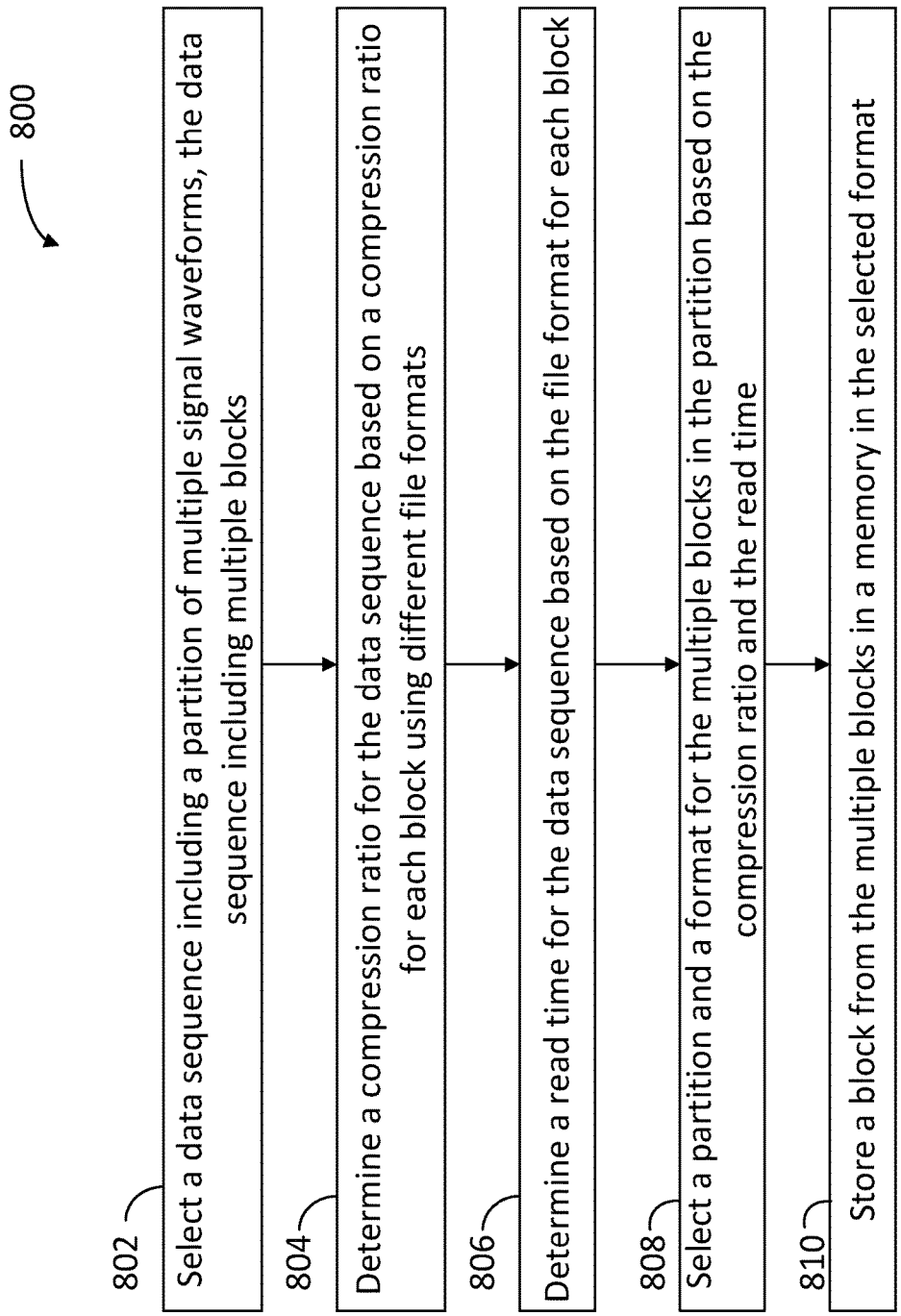
FIG. 8 illustrates a flow chart including steps in a method for adaptive partition and compression of data blocks, according to some embodiments.

FIG. 8 illustrates a flow chart 800 including steps in a method for adaptive partition and compression of data blocks, according to some embodiments. At least some of the steps in method 800 may be performed by a computer having a processor executing commands stored in a memory of the computer (e.g., client host 202 or server 200, processors 12 or 36, and memories 20 or 30). In some embodiments, at least some of the commands may be stored as part of a constrained analysis application installed in a computer (e.g., application 22 in client host 202, data compression engine 201). Further, steps as disclosed in method 700 may include retrieving, editing, and/or storing files in a database that is part of, or is communicably coupled to, the computer (e.g., simulation database 240). Methods consistent with the present disclosure may include at least some, but not all of the steps illustrated in method 800, performed in a different sequence. Furthermore, methods consistent with the present disclosure may include at least two or more steps as in method 800, performed overlapping in time, or almost simultaneously.

In some embodiments, at least one or more of the steps in method 800 may be performed in a cloud computing environment, wherein a computer may include servers, such as a master server and a slave server. Accordingly, at least some of the steps illustrated in method 800 may be performed in parallel in different processors, following separate computational threads. For example, each of the separate computational threads may be performed by at least one of slave servers in each of multiple applications and processors dedicated to the specific computational thread.

Step 802 includes selecting a data sequence including a partition of multiple signal waveforms, the data sequence including multiple blocks. In some embodiments, step 802 may include identifying blocks of the multiple signal waveforms that include a shared time portion or a shared signal portion.

Step 804 includes determining a compression ratio for the data sequence based on a compression ratio for each block using different file formats. In some embodiments, step 804 includes determining the size of the original block to the size of a data compressed block for each of the multiple blocks, and computing the ratio of the aggregated size of the compressed block to the aggregated size of the original data blocks, for the sequence. In some embodiments, step 804 includes compressing multiple signal portions to a shared signal portion, for multiple signal waveforms in the block. In some embodiments, step 804 may include compressing multiple time portions to a shared time portion, for multiple signal waveforms in the block.

Step 806 includes determining a read time for the data sequence based on the file format for each block. In some embodiments, step 806 includes aggregating the read time for each block in the data sequence. In some embodiments, he read time for each block is based on the metadata portions and the size of each block in the data sequence.

Step 808 includes selecting a partition and a format for the multiple blocks in the partition based on the compression ratio and the read time. In some embodiments, step 808 may include modifying the partition of the multiple signal waveforms into a second set of multiple blocks for a second data sequence. Further, in some embodiments step 808 includes comparing the read time and the compression rate for the second data sequence with the original data sequence. Accordingly, in some embodiments step 808 includes weighting the read time and the compression ratio as desired by the user, to select between the original data sequence or the second data sequence. For example, in some embodiments a first user may prefer a lower read time over a higher data compression of a data sequence, and a second user may prefer a higher data compression over a read time of the data sequence.

Step 810 includes storing a block from the multiple blocks in a memory, in the selected format. In some embodiments, step 810 may include storing a sequence of blocks including the multiple blocks in the database.

Figure 9:
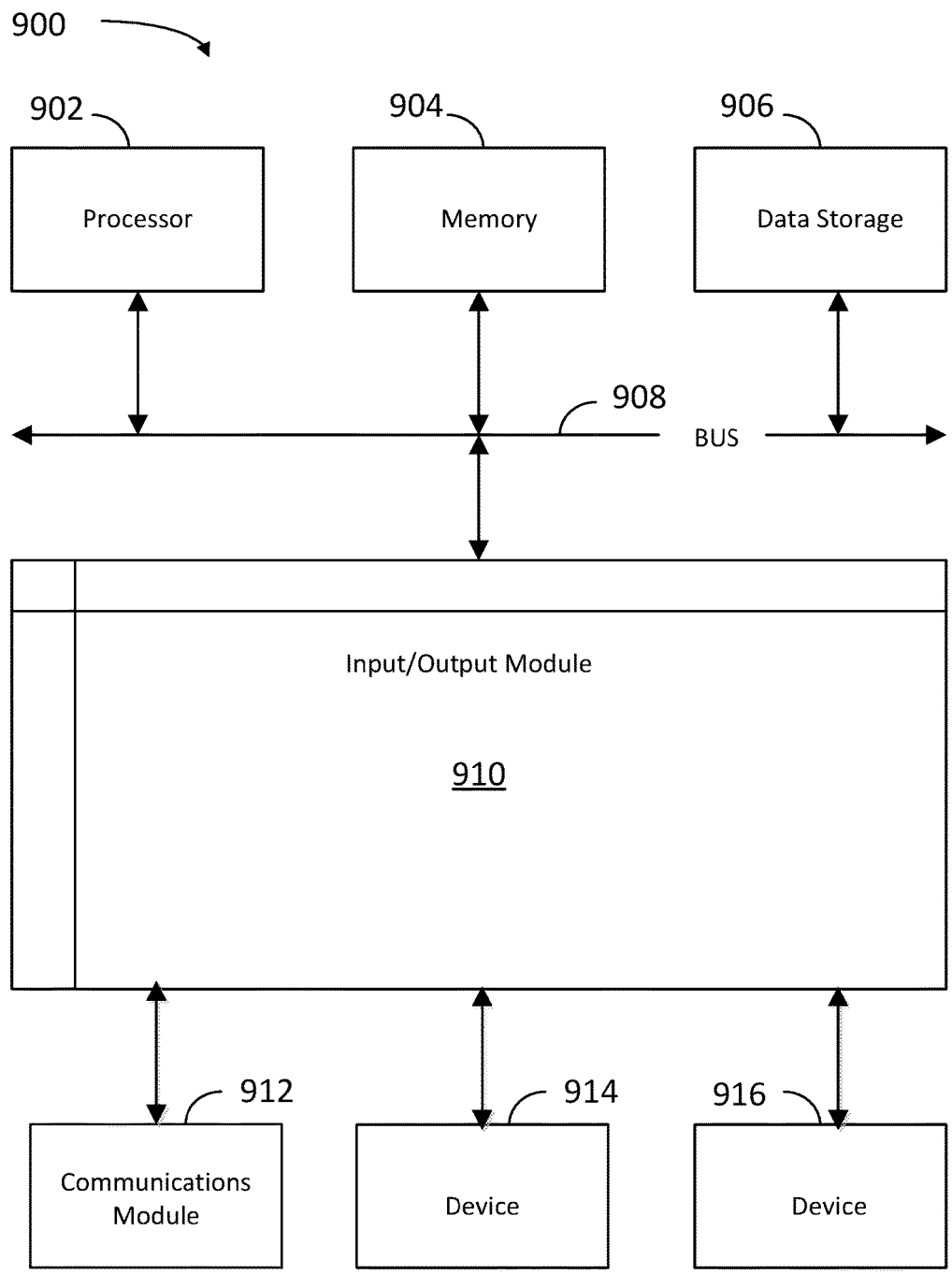
FIG. 9 is a block diagram illustrating an example computer system for lossless data compression, according to some embodiments.

FIG. 9 is a block diagram illustrating an example computer system 900 with which the methods and steps illustrated in methods 700 and 800 can be implemented, according to some embodiments. In certain aspects, computer system 900 can be implemented using hardware or a combination of software and hardware, either in a dedicated server, integrated into another entity, or distributed across multiple entities.

Computer system 900 includes a bus 908 or other communication mechanism for communicating information, and a processor 902 coupled with bus 908 for processing information. By way of example, computer system 900 can be implemented with one or more processors 902. Processor 902 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 902 may include modules and circuits configured as a 'placing' tool or engine, or a 'routing' tool or engine, to place devices and route channels in a circuit layout, respectively and as disclosed herein.

Computer system 900 includes, in addition to hardware, code that creates an execution environment for the computer program in question, e.g., code that constitutes processor firmware, a protocol stack, a database management system, an operating system, or a combination of one or more of them stored in an included memory 904, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 908 for storing information and instructions to be executed by processor 902. Processor 902 and memory 904 can be supplemented by, or incorporated in, special purpose logic circuitry.

The instructions may be stored in memory 904 and implemented in one or more computer program products, i.e., one or more modules of computer program instructions encoded on a computer readable medium for execution by, or to control the operation of, the computer system 900, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 904 may also be used for storing temporary variable or other intermediate information during execution of instructions to be executed by processor 902.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 900 further includes a data storage device 906 such as a magnetic disk or optical disk, coupled to bus 908 for storing information and instructions.

Computer system 900 is coupled via input/output module 910 to various devices. The input/output module 910 is any input/output module. Example input/output modules 910 include data ports such as USB ports. The input/output module 910 is configured to connect to a communications module 912. Example communications modules 912 include networking interface cards, such as Ethernet cards and modems. In certain aspects, the input/output module 910 is configured to connect to a plurality of devices, such as an input device 914 and/or an output device 916. Example input devices 914 include a keyboard and a pointing device, e.g., a mouse or a trackball, by which a user can provide input to the computer system 900. Other kinds of input devices 914 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 916 include display devices, such as a LED (light emitting diode), CRT (cathode ray tube), or LCD (liquid crystal display) screen, for displaying information to the user.

Methods as disclosed herein may be performed by computer system 900 in response to processor 902 executing one or more sequences of one or more instructions contained in memory 904. Such instructions may be read into memory 904 from another machine-readable medium, such as data storage device 906. Execution of the sequences of instructions contained in main memory 904 causes processor 902 to perform the process steps described herein (e.g., as in methods, 700 and 800). One or more processors in a multi-processing arrangement may also be employed to execute the sequences of instructions contained in memory 904. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 900 includes servers and personal computer devices. A personal computing device and server are generally remote from each other and typically interact through a communication network. The relationship of client and server arises by virtue of computer programs running on the respective computers and having a client-server relationship to each other. Computer system 900 can be, for example, and without limitation, a desktop computer, laptop computer, or tablet computer. Computer system 900 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 902 for execution. Such a medium may take many forms, including, but not limited to, non-volatile media, volatile media, and transmission media. Non-volatile media include, for example, optical disks, magnetic disks, or flash memory, such as data storage device 906. Volatile media include dynamic memory, such as memory 904. Transmission media include coaxial cables, copper wire, and fiber optics, including the wires that comprise bus 908. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A computer-implemented method, comprising:
    separating multiple signal waveforms into multiple blocks forming a sequence, each of the blocks comprising at least a portion of each of the multiple signal waveforms;
    identifying a shared time portion and a shared signal portion for the signal waveforms within a first block from the multiple blocks;
    selecting a format for the first block based on a block size of the first block and a block read time of the first block;
    compressing data in the first block based on the shared time portion, the shared signal portion, a preceding block and a subsequent block in the sequence; and
    storing the first block in a memory based on the format selected for the first block.

2. The computer-implemented method of claim 1, wherein separating multiple signal waveforms into multiple blocks forming a sequence comprises receiving multiple signals from a simulation engine, the multiple signals associated with simulated output signals from a system on a chip.

3. The computer-implemented method of claim 1, wherein separating multiple signal waveforms into multiple blocks forming a sequence comprises:
    estimating a compression ratio for the sequence and estimating a read time for the sequence, wherein the sequence comprises a partition of multiple signals from a simulation engine, and
    selecting the partition of multiple signals based on the compression ratio for the sequence and the read time for the sequence.

4. The computer-implemented method of claim 1, wherein separating multiple signal waveforms into multiple blocks forming a sequence comprises performing a linear regression with parameters associated with each of a plurality of randomly selected partitions, and wherein the parameters comprise a block size, a block format, a block compression ratio, and a block read out time.

5. The computer-implemented method of claim 1, wherein selecting a format for the first block comprises selecting a format comprising a single metadata register, the shared time portion, and multiple signal portions associated with the shared time portion.

6. The computer-implemented method of claim 1, wherein selecting a format for the first block comprises selecting a format comprising multiple metadata registers with a shared time portion and multiple signal portions associated with the shared time portion when the preceding block comprises a single metadata register and the subsequent block comprises multiple time portions.

7. The computer-implemented method of claim 1, wherein selecting a format for the first block comprises selecting a format comprising multiple metadata registers with multiple time portions and multiple signal portions, wherein each metadata register is associated with a time portion and a signal portion.

8. The computer-implemented method of claim 1, wherein selecting the format for the first block comprises forming the sequence such that a hybrid block is placed between a single time portion block and a multiple time portion block, and wherein the hybrid block comprises multiple metadata registers associated with multiple signal portions.

9. The computer-implemented method of claim 1, wherein storing the first block in a memory based on the format selected for the block comprises inserting a metadata register for the shared time portion and for the shared signal portion, wherein the metadata register comprises a memory address and a length for a location of the shared time portion and the shared signal portion in the sequence.

10. The computer-implemented method of claim 1, further comprising including a metadata register for a first block matching a metadata register for a preceding block.

11. A system, comprising:
a memory, storing computer code; and
at least one processor that executes the computer code to:
- separate multiple signal waveforms into multiple blocks forming a sequence, each of the blocks comprising at least a portion of each of the multiple signal waveforms;
- identify a shared time portion and a shared signal portion for the signal waveforms within a first block from the multiple blocks;
- select a format for the first block based on a block size of the first block and a block read time of the first block;
- compress data in the first block based on the shared time portion, the shared signal portion, a preceding block and a subsequent block in the sequence; and
- store the first block in a memory based on the format.

12. The system of claim 11, wherein to separate multiple signal waveforms into multiple blocks forming a sequence, the at least one processor executes commands to receive multiple signals from a simulation engine, the multiple signals associated with simulated output signals from a system on a chip.

13. The system of claim 11, wherein to separate multiple signal waveforms into multiple blocks forming a sequence, the at least one processor executes commands to:
- estimate a compression ratio for the sequence and estimating a read time for the sequence, wherein the sequence comprises a partition of multiple signals from a simulation engine, and
- select the partition of multiple signals based on the compression ratio for the sequence and the read time for the sequence.

14. The system of claim 11, wherein to select a format for the first block, the at least one processor executes commands to select a format comprising a single metadata register, the shared time portion, and multiple signal portions associated with the shared time portion.

15. The system of claim 11, wherein to separate multiple signal waveforms into multiple blocks forming a sequence the at least one processor executes instructions to perform a linear regression with parameters associated with each of a plurality of randomly selected partitions, and wherein the parameters comprise a block size, a block format, a block compression ratio, and a block read out time.

16. The system of claim 11, wherein to select a format for the first block the at least one processor executes instructions to select a format comprising multiple metadata registers with a shared time portion and multiple signal portions associated with the shared time portion when the preceding block comprises a single metadata register and the subsequent block comprises multiple time portions.

17. A non-transitory, computer-readable medium comprising instructions stored in a memory which, when executed by a processor cause a computer to perform a method, the method comprising:
- separating multiple signal waveforms into multiple blocks forming a sequence, each of the blocks comprising at least a portion of each of the multiple signal waveforms;
- identifying a shared time portion and a shared signal portion for the signal waveforms within a first block from the multiple blocks;
- selecting a format for the first block based on a block size of the first block and a block read time of the first block;
- compressing data in the first block based on the shared time portion, the shared signal portion, a preceding block and a subsequent block in the sequence; and
- storing the first block in a memory based on the format selected for the first block.

18. The non-transitory, computer readable medium of claim 17, wherein separating multiple signal waveforms into multiple blocks forming a sequence comprises receiving multiple signals from a simulation engine, the multiple signals associated with simulated output signals from a system on a chip.

19. The non-transitory, computer readable medium of claim 17, wherein separating multiple signal waveforms into multiple blocks forming a sequence comprises:
- estimating a compression ratio for the sequence and estimating a read time for the sequence, wherein the sequence comprises a partition of multiple signals from a simulation engine, and
- selecting the partition of multiple signals based on the compression ratio for the sequence and the read time for the sequence.

20. The non-transitory, computer readable medium of claim 17, wherein separating multiple signal waveforms into multiple blocks forming a sequence comprises performing a linear regression with parameters associated with each of a plurality of randomly selected partitions, and wherein the parameters comprise a block size, a block format, a block compression ratio, and a block read out time.

* * * * *